(12) United States Patent
Tsorng et al.

(10) Patent No.: US 11,212,933 B2
(45) Date of Patent: Dec. 28, 2021

(54) UNIVERSAL CARRIER FOR OCP MODULES

(71) Applicant: Quanta Computer Inc., Taoyuan (TW)

(72) Inventors: Yaw-Tzorng Tsorng, Taoyuan (TW);
Shin-Ming Su, Taoyuan (TW);
Tung-Hsien Wu, Taoyuan (TW);
Wen-Jui Yu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 99 days.

(21) Appl. No.: 16/821,741

(22) Filed: Mar. 17, 2020

(65) Prior Publication Data
US 2021/0120695 A1 Apr. 22, 2021

Related U.S. Application Data

(60) Provisional application No. 62/923,005, filed on Oct. 18, 2019.

(51) Int. Cl.
*H05K 7/14* (2006.01)
*H05K 1/18* (2006.01)
*H05K 1/11* (2006.01)
*H01R 12/70* (2011.01)
*H01R 12/71* (2011.01)

(52) U.S. Cl.
CPC .......... *H05K 7/1487* (2013.01); *H05K 1/117* (2013.01); *H05K 1/18* (2013.01); *H05K 7/1417* (2013.01); *H01R 12/7047* (2013.01); *H01R 12/716* (2013.01); *H05K 2201/10189* (2013.01); *H05K 2201/2036* (2013.01)

(58) Field of Classification Search
CPC .......... H05K 7/1487; H05K 1/17; H05K 1/18; H05K 1/1417
USPC .......................................................... 439/74
See application file for complete search history.

(56) References Cited

U.S. PATENT DOCUMENTS

| 7,283,356 | B2* | 10/2007 | Kobayashi | G06F 1/1616 |
| | | | | 361/679.31 |
| 10,140,238 | B2* | 11/2018 | Mundt | G06F 13/409 |
| 10,537,035 | B2* | 1/2020 | Adrian | G11B 5/4806 |
| 10,588,237 | B2* | 3/2020 | Zhai | H05K 7/1487 |
| 10,929,320 | B1* | 2/2021 | Chou | G06F 13/20 |
| 11,003,613 | B2* | 5/2021 | Escamilla | G06F 13/409 |
| 11,032,932 | B1* | 6/2021 | Chen | H05K 7/02 |
| 2015/0277512 | A1* | 10/2015 | Davis | G06F 1/183 |
| | | | | 361/679.31 |
| 2015/0355686 | A1* | 12/2015 | Heyd | G06F 1/187 |
| | | | | 361/679.31 |
| 2018/0101500 | A1* | 4/2018 | Heyd | H05K 7/14 |

* cited by examiner

*Primary Examiner* — Alexander Gilman
(74) *Attorney, Agent, or Firm* — Nixon Peabody LLP

(57) ABSTRACT

An adaptor assembly for an OCP 2.0 form factor card for installation in a server having a side slot to accommodate OCP 3.0 form factor cards is disclosed. The adaptor assembly has an adaptor board allowing the attachment of the OCP 2.0 form factor. The adaptor board includes a socket mateable with a connector on the OCP 2.0 form factor and an edge connector mateable with a socket on the server. The assembly includes an adaptor bracket attachable to the adaptor board. The adaptor bracket has a wall that covers the side slot of the server when the adaptor assembly is inserted through the side slot.

18 Claims, 7 Drawing Sheets

UNIVERSAL CARRIER FOR OCP MODULES

PRIORITY CLAIM

This application claims priority under 35 U.S.C. § 119 to U.S. Provisional Application No. 62/923,005, filed on Oct. 18, 2019. The contents of that application are hereby incorporated by reference in their entirety.

TECHNICAL FIELD

The present disclosure relates generally to an adaptor for Open Computing Project (OCP) cards that may be inserted into modular slots in a server. More particularly, aspects of this disclosure relate to an integrated adaptor assembly that allows older OCP cards to be installed into slots for more recent OCP modules.

BACKGROUND

Electronic devices, such as servers, include numerous electronic components that are powered by a common power supply. Generally, servers are directed toward specific functions such as storing large amounts of data or processing. Server design begins with a chassis that includes power components and general controllers such as a baseboard management controller. Current server designs include a large number of slots that accept device cards that may be plugged-in to perform server functions. For example, a storage server may include numerous solid state drive (SSD) device cards, while a processing server may include more device cards with processing units. Another example of a slot type is a slot for devices manufactured accordingly to the Open Computing Project (OCP) protocol. The OCP issues periodic standard specifications that provide requirements for devices with form factors that meet such specifications.

A current generation of device cards meeting the requirements of the OCP 2.0 Specification has a different form factor than the form factor of the more recent device cards, according to the OCP 3.0 Specification. Thus, the installation of OCP 3.0 cards in a server chassis require different physical structures than those in a server chassis that may support OCP 2.0 card form factors.

FIG. 1A is a perspective view of a prior art form factor 10 for an OCP 2.0 card. In this example, the form factor 10 is an SFPX2 type form factor compliant with OCP 2.0. The form factor 10 has a circuit board 12 that supports the components of the card. The circuit board 12 includes two quad small form factor pluggable modules 14 and a rectangular heat sink 16. The circuit board 12 also includes a 120 pin board-to-board connector 18 (Connector A according to the OCP 2.0 Specification), an 80 pin board-to-board connector 20 (Connector B according to the OCP 2.0 Specification), and a parallel 64 pin board-to-board connector 22 (Connector C according to the OCP 2.0 Specification). The board-to-board connector 18 is on the opposite side of the heat sink 16 from the board-to-board connectors 20 and 22. There are other types of OCP 2.0 compliant form factors that may not include either a Connector B or a Connector C.

FIG. 1B is a perspective view of a prior art server assembly 30 for installation of the form factor 10 of the OCP 2.0 card. The server assembly 30 has a chassis 32 that includes a motherboard 34. A top cover (not shown) must be removed from the chassis 32 to install the form factor of the OCP 2.0 card from the top of the chassis 32. The board-to-board connectors 18, 20, and 22 of the OCP 2.0 card in FIG. 1A are inserted in corresponding sockets 38, 40, and 42 on the motherboard 34 when the form factor 10 is installed. When the form factor 10 is installed, the quad small form factor pluggable modules 14 extend from a side 44 of the chassis 32 to allow connectors to be installed in ports of the quad small form factor pluggable modules 14.

In contrast, the form factor of an OCP 3.0 card does not require the removal of a top cover of a server chassis because such cards may be inserted through the side of the server chassis. FIG. 1C is a perspective view of small form factor (SFF) 50 of an OCP 3.0 card and a prior art server chassis 60 for installation of the card 50 on a motherboard 62. FIG. 1D is a perspective view of the small form factor 50 independent of the server chassis 60. The small form factor 50 includes a motherboard 52 that is enclosed by a cover 54. The motherboard 52 supports various electronic components including a network interface controller module that may include small form factor pluggable modules 56. One edge of the form factor 50 includes a straddle connector 58.

In this example, the server chassis 60 includes a chassis body 64 with a side slot 66 that allows the form factor 50 to be inserted from the side of the chassis body 64. The small form factor pluggable modules 56 extend through an aperture 70 in a wall 72 opposite the straddle connector 48 of the form factor 50. When the small form factor 50 is inserted fully through the side slot 66, the straddle connector 58 is connected to a socket 68. When the form factor 50 is inserted through the side slot 66, the wall 72 is located near the side of the chassis body 64, and thus the ports of the small form factor pluggable modules 56 extend from the chassis body 64.

The form factor 50 of the OCP 3.0 card thus eliminates the need for removing a cover of the chassis body 64 to install the card since the entire form factor 50 may be installed from the side of the chassis body 64. Other form factors for an OCP 3.0 cards may be comparatively larger than the form factor 50. For example, a large form factor for OCP 3.0 cards has a longer width than the form factor 50 in FIGS. 1C-1D, allowing more components to be mounted in the form large form factor. The large form factor still includes an edge connector that is plugged into the socket 68. An optional second edge connector may be provided.

Unfortunately, a server chassis with slots and corresponding structures that accommodate OCP 3.0 form factors does not allow physical mating to an OCP 2.0 card form factor. Thus servers that only have the more recent connection structures for OCP 3.0 cards cannot operate OCP 2.0 cards without substantial modification or additional components.

Thus, there is a need for an adaptor which may be used for adapting OCP 2.0 form factors for use in servers that have slot structures for OCP version 3.0 card form factors. There is another need for a toolless mechanism to mount an OCP 2.0 card in a server slot for OCP 3.0 form factors without removing a common cover. There is also a need for an adaptor that allows the connector of an OCP 2.0 form factor to be adapted to a connector socket on a motherboard for an OCP 3.0 device.

SUMMARY

One disclosed example is an adaptor assembly for an OCP 2.0 form factor card for installation in a server having a side slot to accommodate OCP 3.0 form factor cards. The adaptor assembly has an adaptor board allowing the attachment of the OCP 2.0 form factor. The adaptor board includes a socket mateable with a connector on the OCP 2.0 form factor and an edge connector mateable with a socket on the server. The assembly includes an adaptor bracket attachable to the adaptor board. The adaptor bracket has a wall that covers the side slot of the server when the adaptor assembly is inserted through the side slot.

A further implementation of the example adaptor assembly is where the OCP 2.0 form factor card is one of SFPX1, SFPX2, SFPX4, QSFP X1, QSFP X2, RJ-45 X2, RJ-45 X4, or Mezzanine types. Another implementation is where the wall includes an aperture that allows access to at least one small form factor pluggable module on the OCP 2.0 form factor. Another implementation is where the adaptor board includes a cut-out shaped to accommodate the at least one small form factor pluggable module. Another implementation is where the adaptor board includes a distal end and a proximal end. The distal end includes the edge connector. The length between the distal end and the proximal end is similar to the length of an OCP 3.0 form factor installable in the server. Another implementation is where the adaptor board includes at least one spacer extending to space the form factor from the adaptor board when the form factor is attached to the adaptor board. Another implementation is where at least one connection mechanism attaches a circuit board of the form factor to the at least one spacer. Another implementation is where the socket is a 120 pin socket, and the connector is a connector A according to the OCP 2.0 specification. Another implementation is where the adaptor board includes a second socket mateable with a second connector on the OCP 2.0 form factor.

Another disclosed example is a form factor assembly for insertion in a slot in a server for OCP 3.0 form factors. The assembly includes an OCP 2.0 form factor including a circuit board having a connector. The assembly includes an adaptor board attached to the OCP 2.0 form factor. The adaptor board includes a socket mated with the connector of the circuit board of the OCP 2.0 form factor and an edge connector mateable with a socket on the server. An adaptor bracket is attached to the adaptor board. The adaptor bracket has a wall that covers the side slot of the server when the assembly is inserted through the side slot.

A further implementation of the example form factor assembly is where the OCP 2.0 form factor card is one of SFPX1, SFPX2, SFPX4, QSFP X1, QSFP X2, RJ-45 X2, RJ-45 X4, or Mezzanine types. Another implementation is where the wall includes an aperture that allows access to at least one small form factor pluggable module on the OCP 2.0 form factor. Another implementation is where the adaptor board includes a cut-out shaped to accommodate the at least one small form factor pluggable module. Another implementation is where the adaptor board includes a distal end and a proximal end. The distal end includes the edge connector. The length between the distal end and the proximal end is similar to the length of an OCP 3.0 form factor installable in the server. Another implementation is where the adaptor board includes at least one spacer extending to space the form factor from the adaptor board when the form factor is attached to the adaptor board. Another implementation is where at least one connection mechanism attaches a circuit board of the form factor to the at least one spacer. Another implementation is where the socket is a 120 pin socket, and the connector is a connector A according to the OCP 2.0 specification. Another implementation is where the adaptor board includes a second socket mateable with a second connector on the OCP 2.0 form factor.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
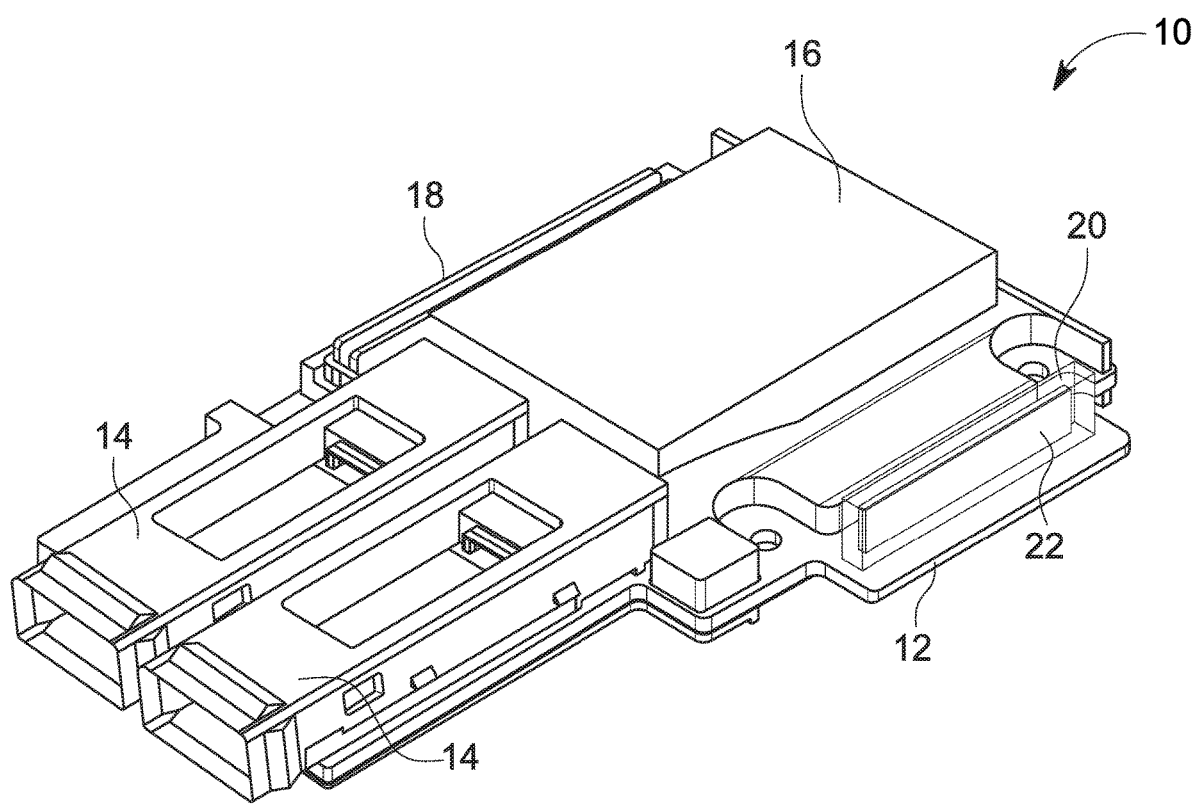
FIG. 1A is a perspective view of an example prior art form factor of an OCP 2.0 card.
Figure 1B:
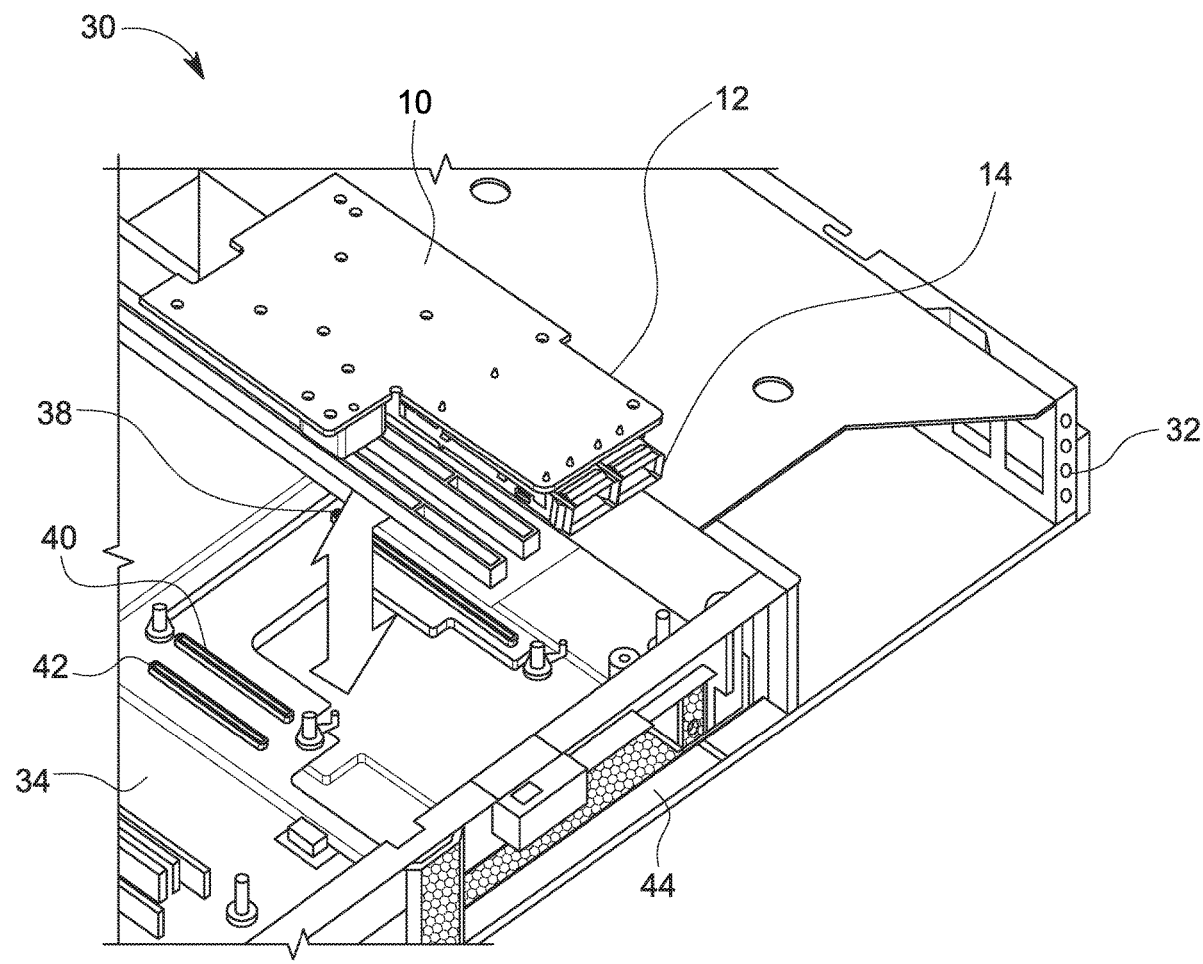
FIG. 1B is a perspective view of a prior art server motherboard assembly for installation of the form factor of the OCP 2.0 card in FIG. 1A.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward an example adaptor board and adaptor bracket that allows OCP 2.0 card form factors to be installed into server chassis assemblies with slots designed for accommodating a OCP 3.0 card form factor. The assembly of an adaptor board and adaptor bracket to the circuit board of an OCP 2.0 form factor allows that OCP 2.0 form factor to be inserted from the side of a server chassis, similar to the insertion of an OCP 3.0 card. Thus, the assembly of these adaptor components allows form factors of OCP 2.0 cards to be inserted from the side of server chassis assemblies having slots to accommodate OCP 3.0 cards.

Figure 1C:
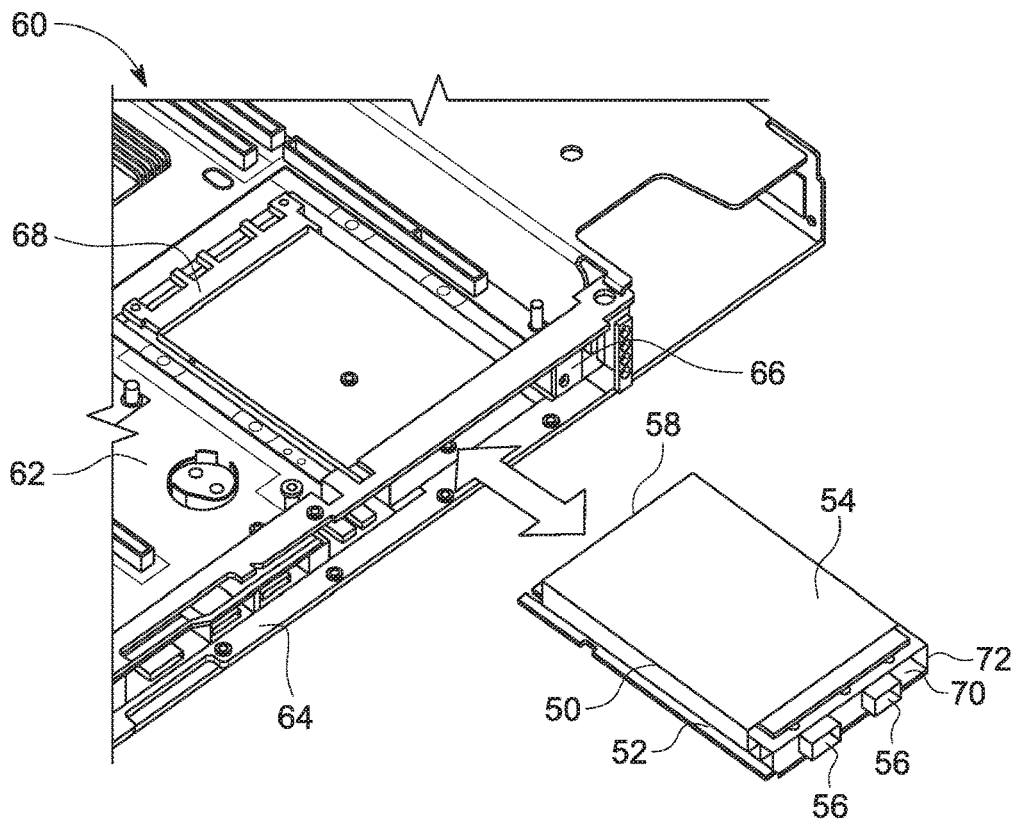
FIG. 1C is a perspective view of a small form factor (SFF) for an OCP 3.0 card and a prior art server motherboard assembly for installation of the small form factor.
Figure 1D:
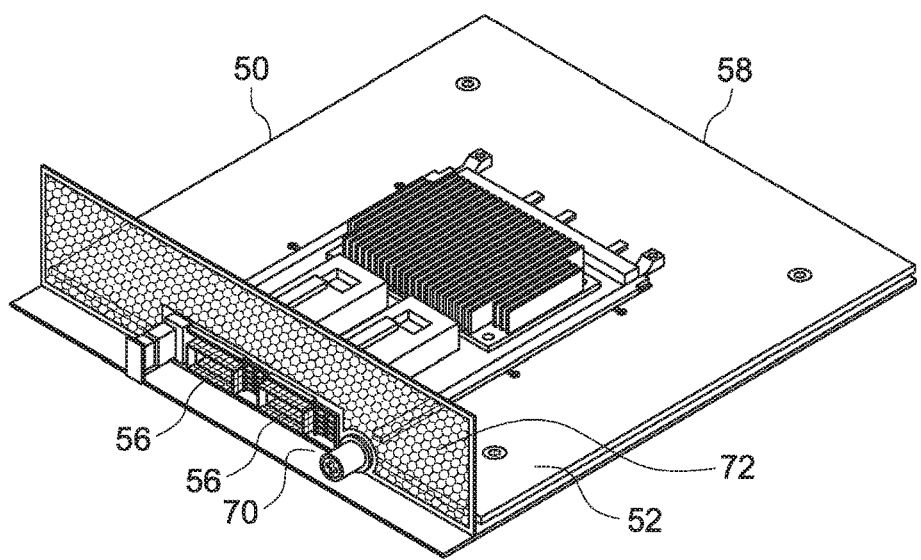
FIG. 1D is a perspective view of a prior art small form factor (SFF) for an OCP 3.0 card in FIG. 1C.
Figure 2:
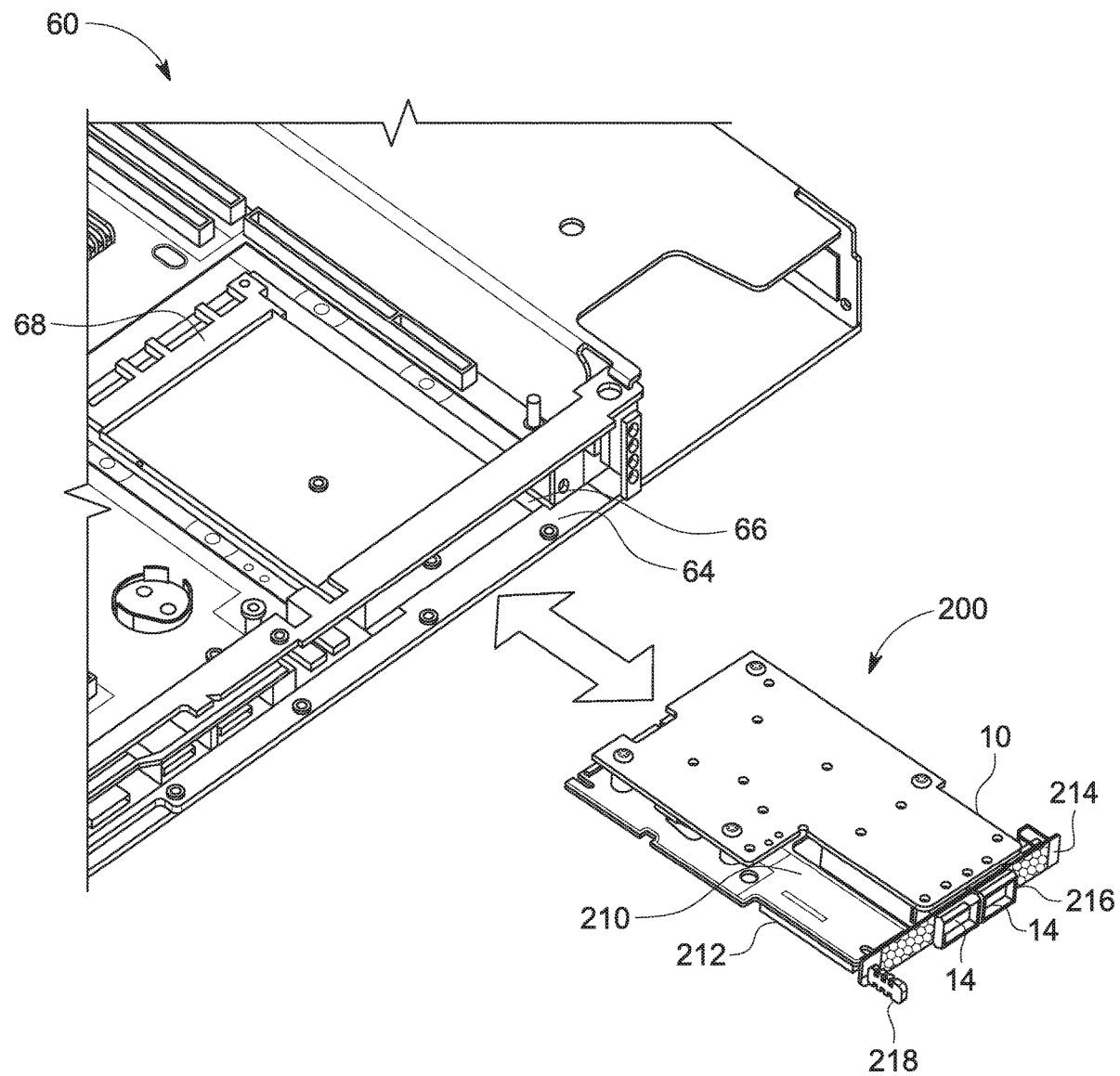
FIG. 2 is a perspective view of a server having an OCP 3.0 card slot and an example adapter assembly for an OCP 2.0 form factor, according to certain aspects of the present disclosure.

FIG. 2 is a perspective diagram of an adaptor assembly 200 that allows an OCP 2.0 card form factor, such as the form factor 10 in FIG. 1A, to be installed in a server chassis, such as the server chassis 60 that includes a slot that accommodates an OCP 3.0 card form factor. Like element numbers from FIGS. 1A and 1C identify identical elements on the form factor 10 and the server chassis 60 in FIG. 2. In this example, the form factor 10 is a SFPX2 type that may hold OCP 2.0 device cards. Other OCP 2.0 compliant form factors such as the SFPX1 type, SFPX4 type, the QSFP X1 type, the QSFP X2 type, the RJ-45 X2 type or the RJ-45 X4 type may also use the adaptor assembly 200 to be installed in a slot that accommodates OCP 3.0 card form factors. Mezzanine card types compatible with the adaptor assembly 200 may include PCIe Mezz NIC (types 1-5), KR Mezz (types 1-2), and Max Mezz Profile (types 1-2). These cards may include the A connector and optionally the B and C connector.

The adaptor assembly 200 includes the OCP 2.0 card form factor 10 (shown in detail in FIG. 1A), an adaptor board 210, and an adaptor bracket 212. The adaptor board 210 includes a cut-out section that is shaped to accommodate the quad small form factor pluggable modules 14 on the form factor 10. As will be explained, the adaptor board 210 includes a socket for mating to the 120 pin board-to-board connector 18 (in FIG. 1A) of the form factor 10. The adaptor board 210 includes an edge connector that may be plugged into the socket 68 of the server chassis 60 that normally accepts the connectors of a OCP 3.0 form factor. The adaptor board 210 thus allows communication between the board-to-board connector 18 and the socket 68.

The adaptor bracket 212 includes a wall 214 that covers the approximate area of the side slot 66 in one wall of the chassis 64 (in FIG. 1C). The chassis wall 214 is a grill structure to assist air flow to the interior of the chassis 64. The chassis wall 214 includes an aperture 216 that allows the small form factor pluggable modules 14 to extend out from the wall 214. The wall 214 includes a tab 218 on one side that extends out from the side of the wall 214. The tab 218 may be used as a handle to assist in maneuvering the adaptor assembly 200 in the slot.

Similar to the form factor 50 in FIG. 1C, the adaptor assembly 200 may be inserted in the slot or aperture 66 to allow the OCP 2.0 form factor 10 to be attached to the chassis body 64. The adaptor assembly 200 is inserted through the slot 66, and the adaptor board 210 is connected to the socket 68. When the adaptor board 210 is connected to the socket 68, the wall 214 of the adaptor bracket 212 is flush with the wall of the chassis body 64. The aperture 216 in the wall 214 allows access to the small form factor pluggable modules 14 of the form factor 10. The ability of the adaptor assembly 200 to be inserted from the side of the chassis 64 obviates the need to remove the top cover of the chassis 64 to install the form factor 10.

Figure 3A:
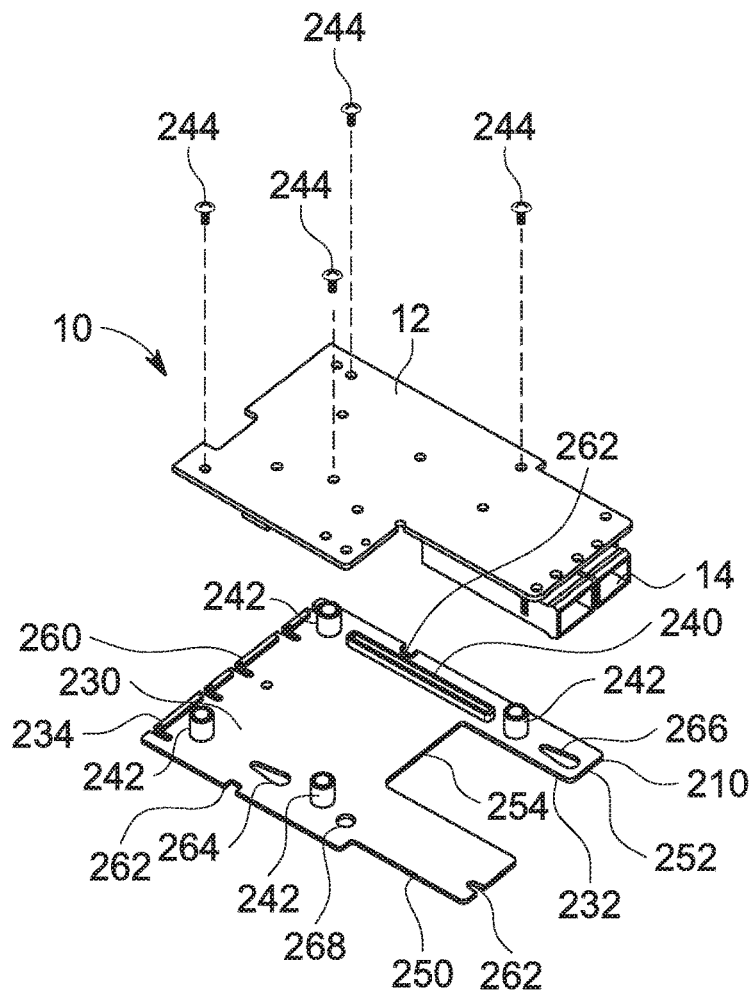
FIG. 3A is an exploded perspective view of the components of an OCP 2.0 card form factor and an example adaptor board allowing attachment to an OCP 3.0 slot, according to certain aspects of the present disclosure.
Figure 3B:
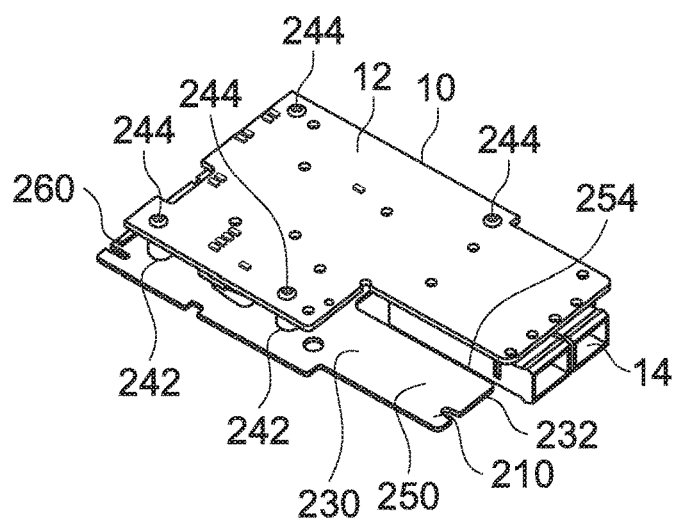
FIG. 3B is a perspective view of the assembled OCP 2.0 card form factor and adaptor board in FIG. 2A, according to certain aspects of the present disclosure.

FIG. 3A is an exploded perspective view of the components of the example OCP 2.0 card form factor 10 and the example adaptor board 210. FIG. 3B is a perspective view of the OCP 2.0 card form factor and the adaptor board 210 assembled. As shown in FIGS. 3A and 3B, the adaptor board 210 has a top surface 230, a proximal end 232, and a distal end 234. The surface area of the adaptor board 210 is approximately the same as an OCP 3.0 form factor such as the form factor 50 shown in FIG. 1C.

The top surface 230 of the adaptor board 210 includes a 120 pin socket 240 that may be mated to the 120 pin board-to-board connector 18 (not shown in FIGS. 3A-3B) of the form factor 10 when the adaptor board 210 is attached to the form factor 10. In this example, the 120 pin board-to-board connector 18 is a Connector A in the original OCP Mezzanine card connector defined in the OCP 2.0 specification. The top surface 230 includes spacer supports 242 that provide separation from the top surface 230 and the form factor 10 when attached to the adaptor board 210. A series of screws 244 may be inserted through holes in the circuit board 12 of the form factor 10 to the spacer supports 242. The screws 244 may be tightened to attach the form factor 10 to the adaptor board 210.

The proximal end 232 of the adaptor board 210 includes two extended arms 250 and 252. The arms 250 and 252 define a cutout 254 that is sized to allow the small form factor pluggable modules 14 to extend from the adaptor board 210, when the form factor 10 is attached, to the adaptor board 210.

The distal end 234 of the adaptor board 210 includes an edge connector 260 having golden finger connectors that may be connected to the socket 68 in the chassis 64 shown in FIGS. 1C and 2. The 120 pin socket 240 is internally connected to the edge connector 260 on the adaptor board 210 to allow electrical communication between the 120 pin socket 240 and the edge connector 260.

The adaptor board 210 includes side notches 262. The adaptor board 210 includes a through aperture 264 opposite the 120 pin socket 240. Another through aperture 266 is located on the arm 252. Another through aperture 268 is located proximate to the arm 250. Pins are inserted through each of the through apertures 264, 266, and 268 to attach the adaptor board 210 to the adaptor bracket 212.

In assembling the form factor 10 and the adaptor board 210, the board-to-board connector 18 of the form factor 10 (shown in FIG. 1A) is connected to the 120 pin socket 240 on the top surface 230 of the adaptor board 210. As shown in FIG. 3B, the circuit board 12 of the form factor 10 will rest on the spacer supports 242. The screws 244 are then inserted and tightened to fix the form factor 10 to the adaptor board 210. The combined assembly of the form factor 10 and the adaptor board 210 are then attached to the adaptor bracket 212 as the adaptor assembly 200 shown in FIG. 2.

Figure 4A:
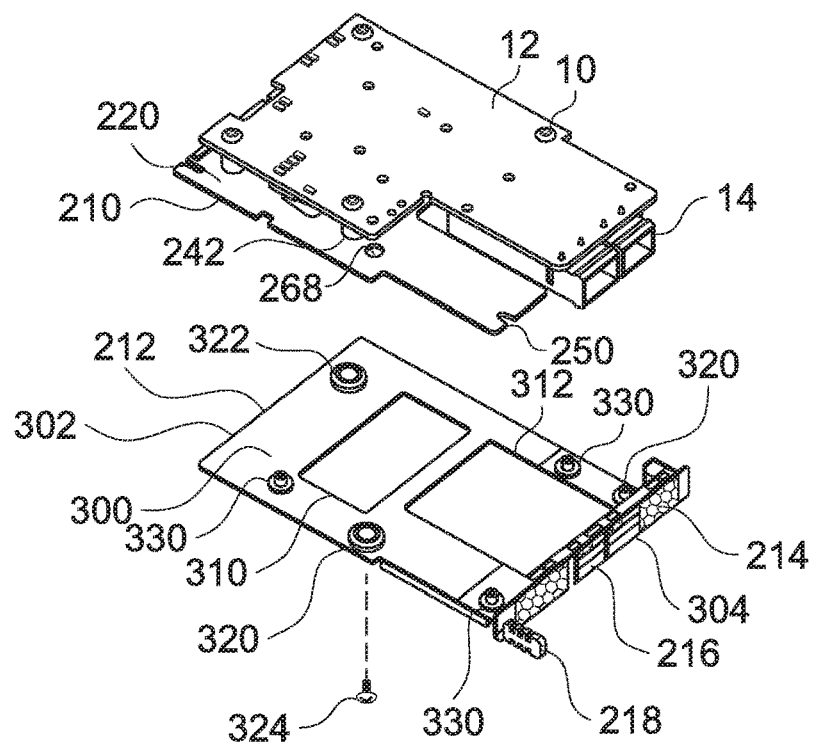
FIG. 4A is an exploded perspective view of the assembled OCP 2.0 card form factor and adaptor board in FIG. 3B and an example adaptor bracket, according to certain aspects of the present disclosure.
Figure 4B:
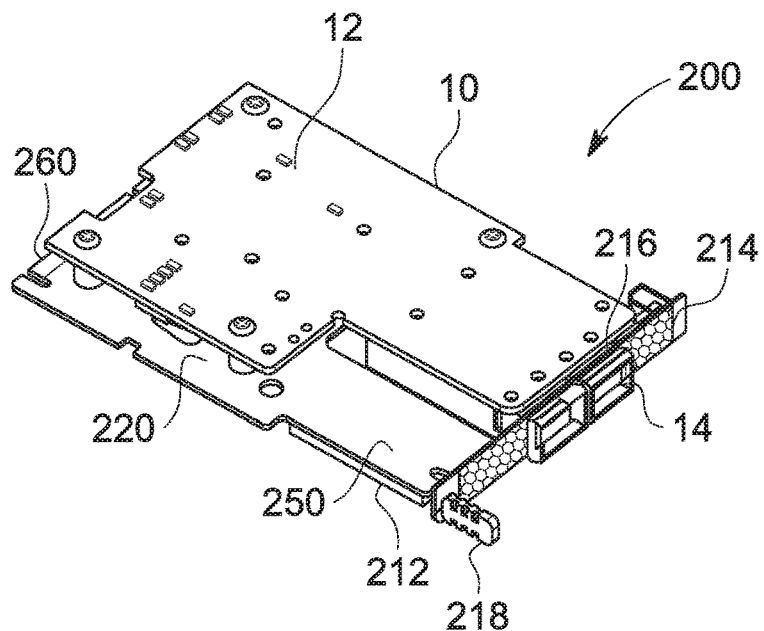
FIG. 4B is a perspective view of the assembled OCP 2.0 card form factor, adaptor board and the adapter bracket in FIG. 4A, according to certain aspects of the present disclosure.

FIG. 4A is an exploded perspective view of the assembled OCP 2.0 card form factor 10 and adaptor board 210 in FIG. 3B and the example adaptor bracket 212. FIG. 4B is a perspective view of the assembled OCP 2.0 card form factor 10, adaptor board 210, and the adapter bracket 212. Like element numbers from the previous figures identify identical elements in FIGS. 4A-4B.

The adaptor bracket 212 includes a support panel 300. The support panel 300 has a proximal end 302 and a distal end 304. The distal end 304 is defined by the wall 214 that extends perpendicularly from the support panel 300.

The support panel 300 includes a first rectangular cutout 310 that is near the proximal end 302. A second rectangular cutout 312 borders the wall 214 on the distal end 304 of the support panel 300. The cutout 312 allows small form factor pluggable modules 14 of the form factor 10 to be extended out of the bottom surface of the support panel 300.

The support panel 300 includes a series of screw apertures 320 that align with the locations of mounting holes such as the hole 268 in the adaptor board 210. Screws 324 may be inserted through the screw apertures 320 to attach the adaptor bracket 212 to the adaptor board 210. The support panel 300 also includes guide pins 322 and 330 that align the adaptor board 210 with the support panel 300 when the adaptor board 210 is assembled to the adaptor bracket 212. The adaptor board 210 is thus first aligned with the adapter bracket 212 by inserting the guide pins 322 and 330 in the through apertures 264, 266, and 268. The screws 324 are then inserted to join the adaptor board 210 with the adapter bracket 212.

After assembly of the form factor 10 with the adaptor board 210, as explained in reference to FIGS. 3A-3B, the adaptor bracket 212 is joined to the assembled adaptor board 210 and form factor 10 to form the adaptor assembly 200 shown in FIG. 2. The adaptor bracket 212 is positioned so the small form factor modules 14 are inserted in the cutout 312, and the ports of the modules 14 extend through the aperture 216 in the front wall 304. The screws 324 are then inserted and tightened to join the adaptor bracket 212 to the adaptor board 210.

The adaptor board 210 may be adopted to be inserted into slots designed for OCP 3.0 form factors other than the small form factor 50 in FIG. 1C. For example, the adaptor assembly 200 may be used for larger OCP 3.0 form factor slots.

Figure 5:
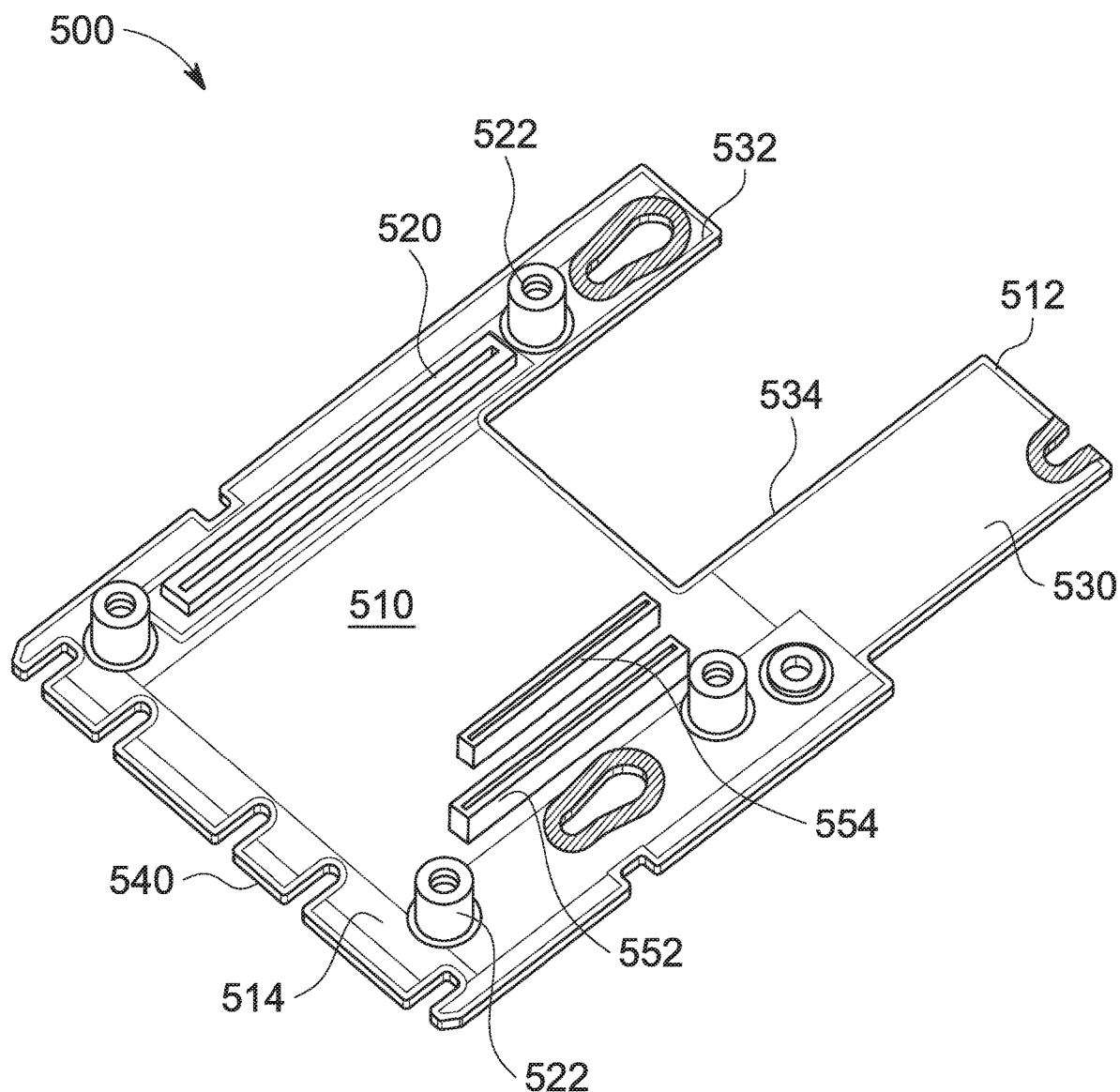
FIG. 5 is a perspective view of an alternative adaptor board for the example adaptor assembly with slots for a B connector and a C connector, according to certain aspects of the present disclosure.

Further, the adaptor assembly 200 may be altered for other OCP 2.0 compliant form factors with additional connectors. For example, FIG. 5 shows an alternate adaptor board 500 that may be substituted for the adaptor board 210 in FIG. 3A. The adaptor board 500 has a top surface 510, a proximal end 512, and a distal end 514. The surface area of the adaptor board 500 is approximately the same as an OCP 3.0 form factor such as the form factor 50 shown in FIG. 1C.

The top surface 510 of the adaptor board 500 includes a 120 pin socket 520 that may be mated to the 120 pin board-to-board connector 18 (not shown in FIGS. 3A-3B) of the form factor 10 when the adaptor board 500 is attached to the form factor 10. In this example, the 120 pin board-to-board connector 18 is a Connector A in the original OCP Mezzanine card connector defined in the OCP 2.0 specification. The top surface 510 includes spacer supports 522 that provide separation from the top surface 510 and the form factor 10 when attached to the adaptor board 500. The proximal end 512 of the adaptor board 210 includes two extended arms 530 and 532. The arms 530 and 532 define a cutout 534 that is sized to allow the small form factor pluggable modules 14 to extend from the adaptor board 500, when the form factor 10 is attached, to the adaptor board 500. The distal end 514 of the adaptor board 500 includes an edge connector 540 having golden finger connectors that may be connected to the socket 68 in the chassis 64 shown in FIGS. 1C and 2.

The adaptor board 550 includes an 80 pin socket 552 on the opposite side of the adaptor board 500. The 80 pin socket 552 may be connected to the 80 pin connector B of certain OCP 2.0 form factors. The 80 pin connector B is defined in Mezzanine card 2.0 Rev 0.40 of the OCP 2.0 specification. The adaptor board 500 also includes a 64 pin socket 554 parallel to the 80 pin socket 552. The 64 pin socket 554 may be connected to the 64 pin connector C of certain OCP 2.0 form factors. The 64 pin connector C is defined in Mezzanine card 2.0 Rev 0.45 of the OCP 2.0 specification. The 120 pin socket 520, the 80 pin socket 552, and the 64 pin socket 554 are all internally connected to the edge connector 540 on the adaptor board 500 to allow electrical communication between the sockets 520, 552, and 554 and the edge connector 540.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An adaptor assembly for an OCP 2.0 form factor card for installation in a server having a side slot to accommodate OCP 3.0 form factor cards, the adaptor assembly comprising:

an adaptor board allowing the attachment of the OCP 2.0 form factor, the adaptor board including a top surface, a socket mateable with a connector on the OCP 2.0 form factor, and an edge connector having golden finger connectors formed on the top surface, the edge connector mateable with a socket on the server; and an adaptor bracket attachable to the adaptor board, the adaptor bracket having a panel parallel to the adaptor board, and a wall perpendicular to the panel that covers the side slot of the server when the adaptor assembly is inserted through the side slot.

2. The adaptor assembly of claim 1, wherein the OCP 2.0 form factor card is one of SFPX1, SFPX2, SFPX4, QSFP X1, QSFP X2, RJ-45 X2, RJ-45 X4, or Mezzanine types.

3. The adaptor assembly of claim 1, wherein the wall includes an aperture that allows access to at least one small form factor pluggable module on the OCP 2.0 form factor.

4. The adaptor assembly of claim 3, wherein the adaptor board includes a cut-out shaped to accommodate the at least one small form factor pluggable module.

5. The adaptor assembly of claim 1, wherein the adaptor board includes a distal end and a proximal end, the distal end including the edge connector, wherein the length between the distal end and the proximal end is similar to the length of an OCP 3.0 form factor installable in the server.

6. The adaptor assembly of claim 1, wherein the adaptor board includes at least one spacer extending to space the form factor from the adaptor board when the form factor is attached to the adaptor board.

7. The adaptor assembly of claim 6, wherein at least one connection mechanism attaches a circuit board of the form factor to the at least one spacer.

8. The adaptor assembly of claim 1, wherein the socket is a 120 pin socket, and the connector is a connector A according to the OCP 2.0 specification.

9. The adaptor assembly of claim 1, wherein the adaptor board includes a second socket mateable with a second connector on the OCP 2.0 form factor.

10. A form factor assembly for insertion in a slot in a server for OCP 3.0 form factors, the assembly comprising:
   an OCP 2.0 form factor including a circuit board having a connector;
   an adaptor board attached to the OCP 2.0 form factor, the adaptor board including a top surface, a socket mated with the connector of the circuit board of the OCP 2.0 form factor, and an edge connector having golden finger connectors formed on the top surface, the edge connector mateable with a socket on the server; and
   an adaptor bracket attached to the adaptor board, the adaptor bracket having a panel parallel to the adaptor broad, and a wall perpendicular to the panel that covers the side slot of the server when the assembly is inserted through the side slot.

11. The form factor assembly of claim 10, wherein the OCP 2.0 form factor card is one of SFPX1, SFPX2, SFPX4, QSFP X1, QSFP X2, RJ-45 X2, RJ-45 X4 or Mezzanine types.

12. The form factor assembly of claim 10, wherein the wall includes an aperture that allows access to at least one small form factor pluggable module on the OCP 2.0 form factor.

13. The form factor assembly of claim 12, wherein the adaptor board includes a cutout shaped to accommodate the at least one small form factor pluggable module.

14. The form factor assembly of claim 10 wherein the adaptor board includes a distal end and a proximal end, the distal end including the edge connector, wherein the length between the distal end and the proximal end is similar to the length of an OCP 3.0 form factor installable in the server.

15. The form factor assembly of claim 11, wherein the adaptor board includes at least one spacer extending to space the form factor from the adaptor board when the form factor is attached to the adaptor board.

16. The form factor assembly of claim 15, wherein at least one connection mechanism attaches a circuit board of the form factor to the at least one spacer.

17. The form factor assembly of claim 11, wherein the socket is a 120 pin socket, and the connector is a connector A according to the OCP 2.0 specification.

18. The form factor assembly of claim 11, wherein the adaptor board includes a second socket mateable with a second connector on the OCP 2.0 form factor.

* * * * *